United States Patent
Fang et al.

(10) Patent No.: US 11,201,285 B2
(45) Date of Patent: Dec. 14, 2021

(54) TECHNIQUES FOR DOPANT IMPLANTATION AND MULTILAYER OXIDES FOR RESISTIVE SWITCHING DEVICES

(71) Applicant: Massachusetts Institute of Technology, Cambridge, MA (US)

(72) Inventors: Nicholas Fang, Lexington, MA (US); Zheng Jie Tan, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 1 day.

(21) Appl. No.: 16/812,082

(22) Filed: Mar. 6, 2020

(65) Prior Publication Data
US 2020/0357991 A1    Nov. 12, 2020

Related U.S. Application Data

(60) Provisional application No. 62/843,932, filed on May 6, 2019.

(51) Int. Cl.
*H01L 45/00* (2006.01)

(52) U.S. Cl.
CPC ............ *H01L 45/146* (2013.01); *H01L 45/08* (2013.01); *H01L 45/1233* (2013.01); *H01L 45/1253* (2013.01)

(58) Field of Classification Search
CPC ............ H01L 45/1233; H01L 45/1253; H01L 45/146; H01L 45/1641
See application file for complete search history.

(56) References Cited

U.S. PATENT DOCUMENTS 8,717,803 B2    5/2014   Rathor et al.
2020/0357991 A1*  11/2020  Fang .................... H01L 45/146

OTHER PUBLICATIONS

Ielmini, Resistive switching memories based on metal oxides: mechanisms, reliability and scaling. Semiconductor Science and Technology. 2016; 31(6):063002.
Lee et al., Excellent uniformity and reproducible resistance switching characteristics of doped binary metal oxides for non-volatile resistance memory applications. IEEE. 2006 International Electron Devices Meeting. Dec. 2006; p. 1-4.
Li et al., Efficient and self-adaptive in-situ learning in multilayer memristor neural networks. Nature Communications. 2018; 9(1):2385.

(Continued)

*Primary Examiner* — Mark V Prenty
(74) *Attorney, Agent, or Firm* — Wolf, Greenfield & Sacks, P.C.

(57) ABSTRACT

The techniques described herein relate to methods and apparatus for a resistive switching device. The resistive switching device includes a first electrode formed in a substrate. The resistive switching device also includes a plurality of layers formed above the first electrode, including a plurality of oxide layers, wherein one or more of the plurality of oxide layers comprise doped oxide layers, and one or more conductive spacers, wherein each pair of oxide layers of the plurality of oxide layers are separated by a conductive spacer of the one or more conductive spacers. The resistive switching device also includes a second electrode formed above the plurality of layers, such that the first electrode, the plurality of layers, and the second electrode are in series.

9 Claims, 6 Drawing Sheets

(56) References Cited

OTHER PUBLICATIONS

Li et al., Three-dimensional crossbar arrays of self-rectifying Si/SiO 2/Si memristors. Nature Conumunications. 2017; 8:15666.
Prost, Logic Circuits with reduced complexity based on devices with higher functionality. 1st, EU 1st Rep. LOCOM. 2000; 28:844.
Wang et al., Improving the electrical performance of resistive switching memory using doping technology. Chinese Science Bulletin. 2012; 57(11): 1235-1240.

* cited by examiner

TECHNIQUES FOR DOPANT IMPLANTATION AND MULTILAYER OXIDES FOR RESISTIVE SWITCHING DEVICES

RELATED APPLICATIONS

This Application claims priority under 35 U.S.C. § 119(e) to U.S. Provisional Application Ser. No. 62/843,932, filed May 6, 2019 and entitled "TECHNIQUES FOR DOPANT IMPLANTATION AND MULTILAYER OXIDES FOR RESISTIVE SWITCHING DEVICES," which is hereby incorporated by reference in its entirety.

STATEMENT OF GOVERNMENT SUPPORT

This invention was made with Government support under Grant No. FA9550-12-1-0488 awarded by the Air Force Office of Scientific Research (AFOSR). The Government has certain rights in the invention.

TECHNICAL FIELD

The techniques described herein relate generally to techniques for using dopant implantation and multilayer oxides for resistive switching devices.

BACKGROUND OF INVENTION

Resistive switching (RS) devices are being touted to replace transistors as fundamental units in next-generation computer circuits. This transformation can be driven by, for example, the difficulty in scaling down transistors any further than those being manufactured at current technology nodes (e.g., at the 7 nm technology node). The transformation can also be driven by, for example, the demands to replace the existing Von Neumann architecture in CPUs with an architecture that will allow for a faster and more power efficient implementation of hardware neuromorphic circuits. The existing Von Neumann architecture was designed at a time where only separate computational (e.g., transistors) and memory (e.g., SRAM, DRAM, flash, etc.) units were available. However, such an architecture cannot keep up with the surging needs of machine learning due to the inherent expenditure on time and power used on transferring large data arrays between the computational and memory units for each iteration of the machine learning training step. RS units are therefore proposed as the fundamental units in dual-purpose computation and memory units intended to realize hardware neuromorphic circuits because they can hold a multi-bit value in storage while enabling computation through its response to some input pulses. These units are the basis of, for example, resistive random-access memory (ReRAM).

At the single device level, these RS unit operate by switching between a high resistance state (HRS) and a low resistance state (LRS) at some set/reset voltage. The resistance state is read by applying a small voltage to probe the device. An ideal RS device is supposed to operate reversibly and should have consistent switching behaviors for each switching cycle.

SUMMARY

In accordance with the disclosed subject matter, apparatus, systems, and methods are provided for using dopant implantation and multilayer oxides for RS devices.

Some embodiments relate to a resistive switching device. The resistive switching device includes a first electrode formed in a substrate. The resistive switching device includes a plurality of layers formed above the first electrode, including a plurality of oxide layers, wherein one or more of the plurality of oxide layers comprise doped oxide layers, and one or more conductive spacers, wherein each pair of oxide layers of the plurality of oxide layers are separated by a conductive spacer of the one or more conductive spacers. The resistive switching device includes a second electrode formed above the plurality of layers, such that the first electrode, the plurality of layers, and the second electrode are in series.

In some examples, the plurality of oxide layers comprises two oxide layers, and the one or more conductive spacers comprise a single conductive spacer separating the two oxide layers.

In some examples, the plurality of oxide layers comprises three oxide layers, and the one or more conductive spacers comprise two conductive spacers, wherein each of the two conductive spacers separates a respective two oxide layers of the three oxide layers.

In some examples, one or more doped oxide layers comprise embedded metal atoms doped using an ion beam used to define a spatial extent of the resistive switching device.

In some examples, each of the plurality of oxide layers comprise a thickness in a range of approximately 1.5 nm to 5 nm.

In some examples, each of the one or more conductive spacers comprise a thickness in a range of approximately 1.5 nm to 5 nm.

In some examples, the first electrode comprises tungsten nitride (WN), titanium nitride (TiN), zirconium nitride (ZrN), hafnium nitride (HfN), vanadium nitride (VN), niobium nitride (NbN), tantalum nitride (TaN), molybdenum nitride (MoN), or chromium nitride (CrN).

In some examples, the second electrode comprises gold (Au).

In some examples, the plurality of oxide layers comprise aluminum oxide ($Al_2O_3$).

In some examples, the one or more conductive spacers each comprise tungsten nitride (WN).

There has thus been outlined, rather broadly, the features of the disclosed subject matter in order that the detailed description thereof that follows may be better understood, and in order that the present contribution to the art may be better appreciated. There are, of course, additional features of the disclosed subject matter that will be described hereinafter and which will form the subject matter of the claims appended hereto. It is to be understood that the phraseology and terminology employed herein are for the purpose of description and should not be regarded as limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1A:
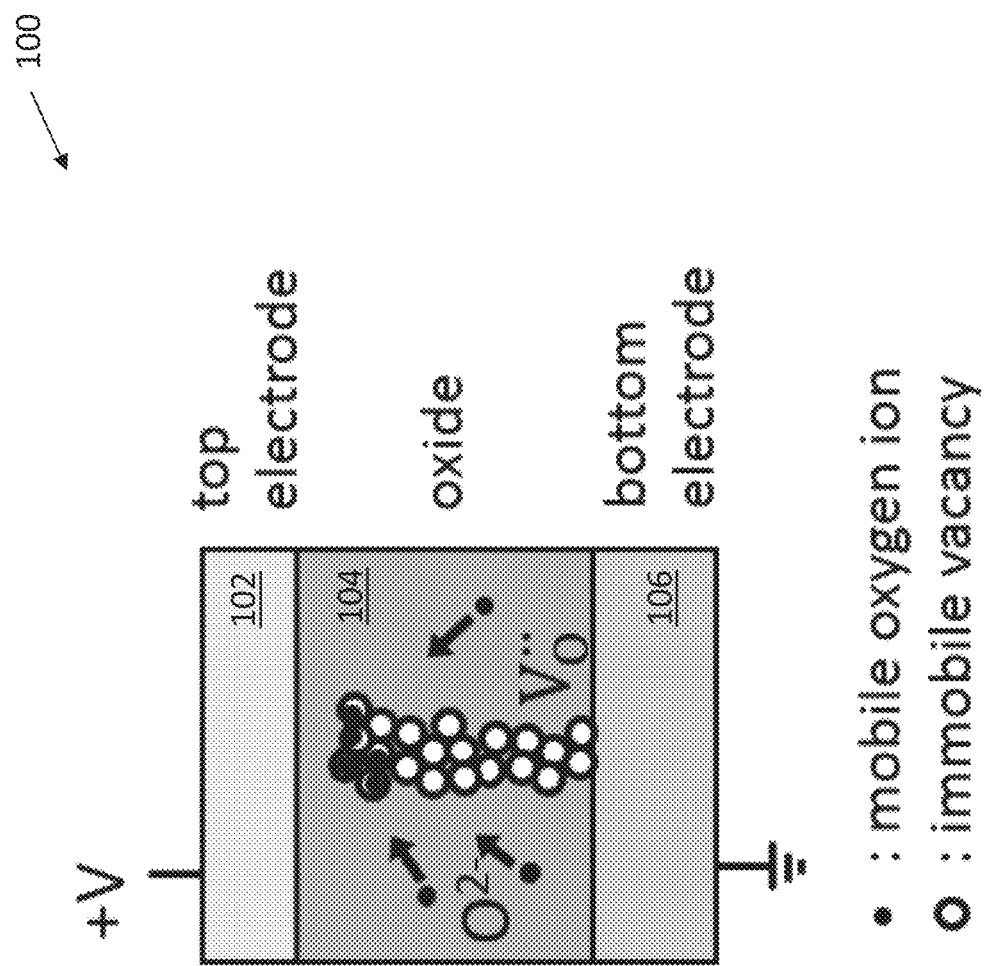
FIG. 1A is a schematic diagram of an exemplary resistive switching (RS) device, according to some embodiments.

The inventors have discovered and appreciated the various drawbacks of existing RS devices. Those in the field have been working on RS devices, including on the switching characteristics such as higher on-off resistance ratios, lower switching times, lower set/reset voltages, and sharper transition. However, the inventors have appreciated that a challenge in producing marketable products with RS units, such as ReRAM chips, lies in the typically poor device yields and inconsistent switching behavior of the RS unit, both in cycle-to-cycle and device-to-device inconsistencies. The poor yields and device variations result from the stochastic nature of the formation of filaments in the insulating dielectric layer of a metal-insulator-metal (MIM) structure and causes I-V curves traced out in a complete set-reset cycle to differ between cycles and between devices. The cycling between HRS and LRS can also terminate abruptly by a permanent breakdown of the dielectric layer. A consistent and predictable switching behavior, e.g., with a variation of less than 20%, is often desired for these devices to be usable h circuit designers in actual circuits.

The techniques described herein provide for strategies to achieve high RS device fabrication yields and switching consistencies, including across cycles, across devices, and/or the like. While the techniques described herein can be applicable to an RS materials system, it should be appreciated that the techniques can also be broadly applicable across other types of materials systems, including to systematically optimize various characteristics of merit of the devices. For example, there are various types of materials that exhibit switching behavior, from most oxides, to perovskites, to organic complexes, and even to 2D materials such as boron nitride and molybdenum disulfide. The inventors discovered and appreciated that current variations in RS devices, which can apply to other types of devices, can be due to existing dimensions of tunability, as discussed herein (e.g., as discussed in conjunction with FIGS. 1A-1B).

The techniques described herein provide for new dimensions of tunability of RS devices, including doping and multiple layer oxides. Advantageously, the techniques described herein can bring current state-of-art devices to even better performance levels by adding to well-tuned material and geometrical choices, instead of needing to replace existing optimized devices entirely. The techniques described herein can use a combination of multiple fabrication strategies (e.g., a combination of the doping and multilayer strategies) to achieve significant improvements in consistencies of resistive switching devices, both in cycle-to-cycle variations and in device-to-device variations. While existing techniques have been only able to achieve incremental changes that have been focused on providing more options in identified areas (e.g., material choice and geometry), the techniques described herein provided entirely new areas of consideration for RS devices (e.g., doping and/or multilayer oxides) that can make possible new classes of device changes, as described further herein. The improvements achievable through the techniques described herein can be used, for example, to implement hardware neuromorphic networks to support the surge in AI-related computation.

In the following description, numerous specific details are set forth regarding the systems and methods of the disclosed subject matter and the environment in which such systems and methods may operate, etc., in order to provide a thorough understanding of the disclosed subject matter. In addition, it will be understood that the examples provided below are exemplary, and that it is contemplated that there are other systems and methods that are within the scope of the disclosed subject matter.

FIG. 1A is a schematic of an exemplary simple resistive switching (RS) device 100, which consists of a top electrode 102, the oxide material 104 and the bottom electrode 106. RS behavior is due to the formation and dissipation of an oxygen vacancy filament in the device. U.S. Pat. No. 8,717,803, titled "Metal-Insulator-Metal-Insulator-Metal (MIMIM) Memory Device," provides an example of a basic resistive switching device, which is hereby incorporated by reference herein in its entirety.

Figure 1B:
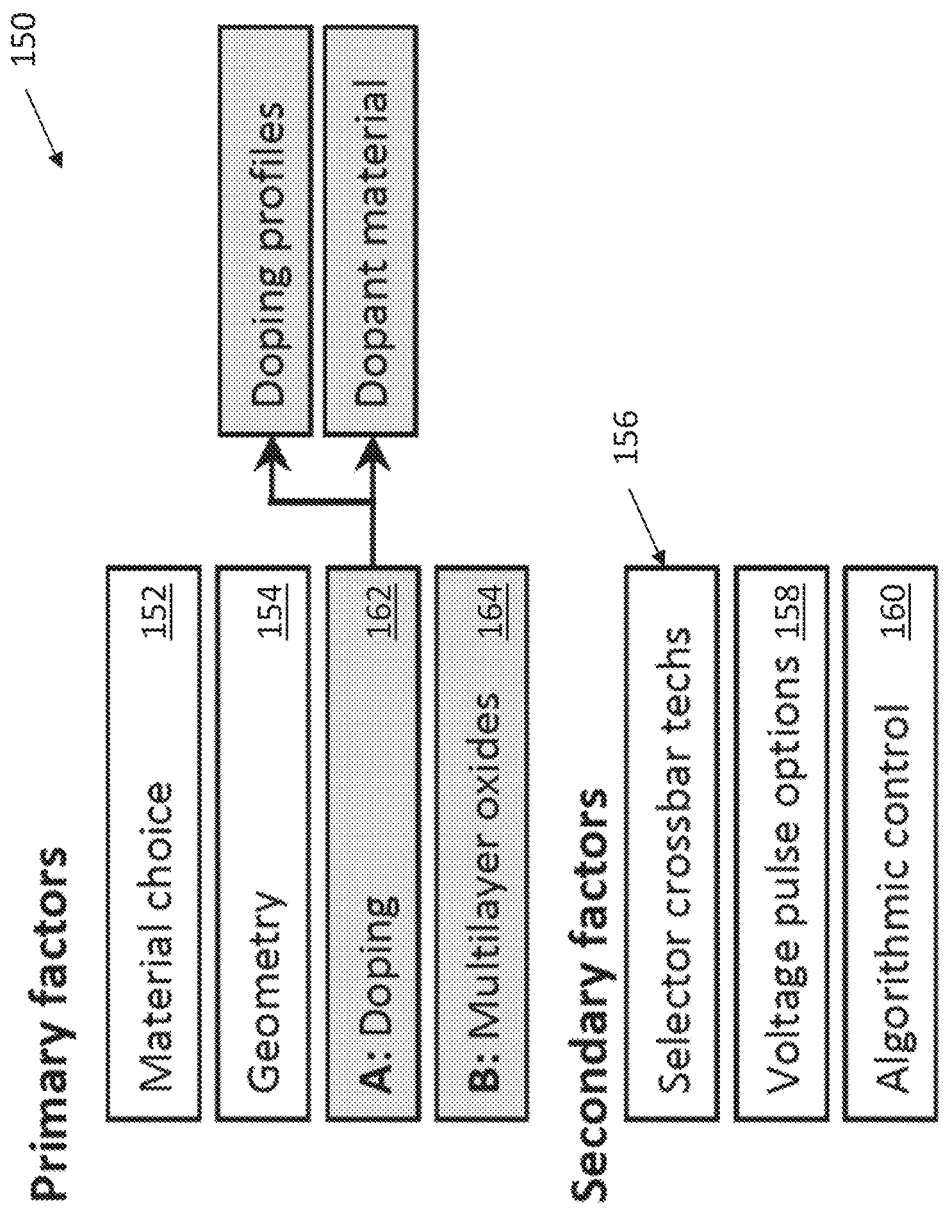
FIG. 1B is a diagram illustrating primary and secondary factors that can affect RS device behavior, according to some embodiments.

FIG. 1B is a diagram 150 showing exemplary factors affecting the device behavior e.g., a simple RS device 100 as shown in FIG. 1A). The primary factors affecting the device behavior can include the material choices 152 for the electrodes and the oxide and their geometry/thickness 154. Secondary factors can include selector crossbar technologies 156, voltage pulse options 158 and algorithmic control 160, which come from parameters which can be tuned when integrating these RS devices into larger arrays, or from an external control circuit of such RS devices. Secondary factors may not directly lead to better RS behavior, but can be workarounds to mitigate the limitations in device performances. As described further herein, the techniques provide for new strategies for designing and fabricating RS devices, which offer new degrees of freedom. For example, a first new degree of freedom is doping 162, and a second new degree of freedom is using a multilayer oxide 164. Such new factors can be primary factors for modifying the RS device behavior, whereas existing techniques instead focus on providing more choices in the other already identified design spaces (e.g., existing primary and secondary considerations, discussed further in conjunction with FIG. 1B). The new degrees of freedom can themselves be rich with further parameters to be tuned for the pursuit of better device performance, such as doping profiles and doping materials for doping.

FIG. 1B shows how the techniques described herein can be a precursor for further derivative strategies. For example, the choice to implant dopants is itself a rich tuning parameter in terms of the choice of dopant material and doping profile/distribution. As another example, the choice to fragment a thick oxide layer into multiple thinner oxides is also rich with possibilities because it lifts the restriction of needing to find different, but suitable, oxide materials to tap into the benefits of using multilayer films. The doping and multilayer oxides, and in particular a combination of such techniques, has yet to be explored for RS devices.

The techniques described herein can therefore provide a set of factors that can affect the final device yield and performance. These factors can include, for example, the choice and thickness of materials used, as well as other factors, such as aging time, which can modify device properties due to relaxation effects. As discussed and demonstrated further herein, doping and a multilayer oxide structure can be important strategies for achieving good switching characteristics.

In some embodiments, an RS device can be formed with a metal-insulator-metal (MIM) structure with almost any combination of metals and/or insulators. The top and bottom metal layers serve as the electrode while the center insulator layer serves as the active switching layer. The metal and/or insulator films can be deposited using a variety of methods such as e-beam deposition, atomic layer deposition (ALD), DC/RF sputtering, and/or the like. The area of each device can be measured based on the intersection area in a cross-bar pattern when the top and bottom metal electrodes are deposited as perpendicular lines, by the area of the top electrode when the top electrode is deposited through a shadowmask, usually as a circular contact pad, or both.

Figure 2A:
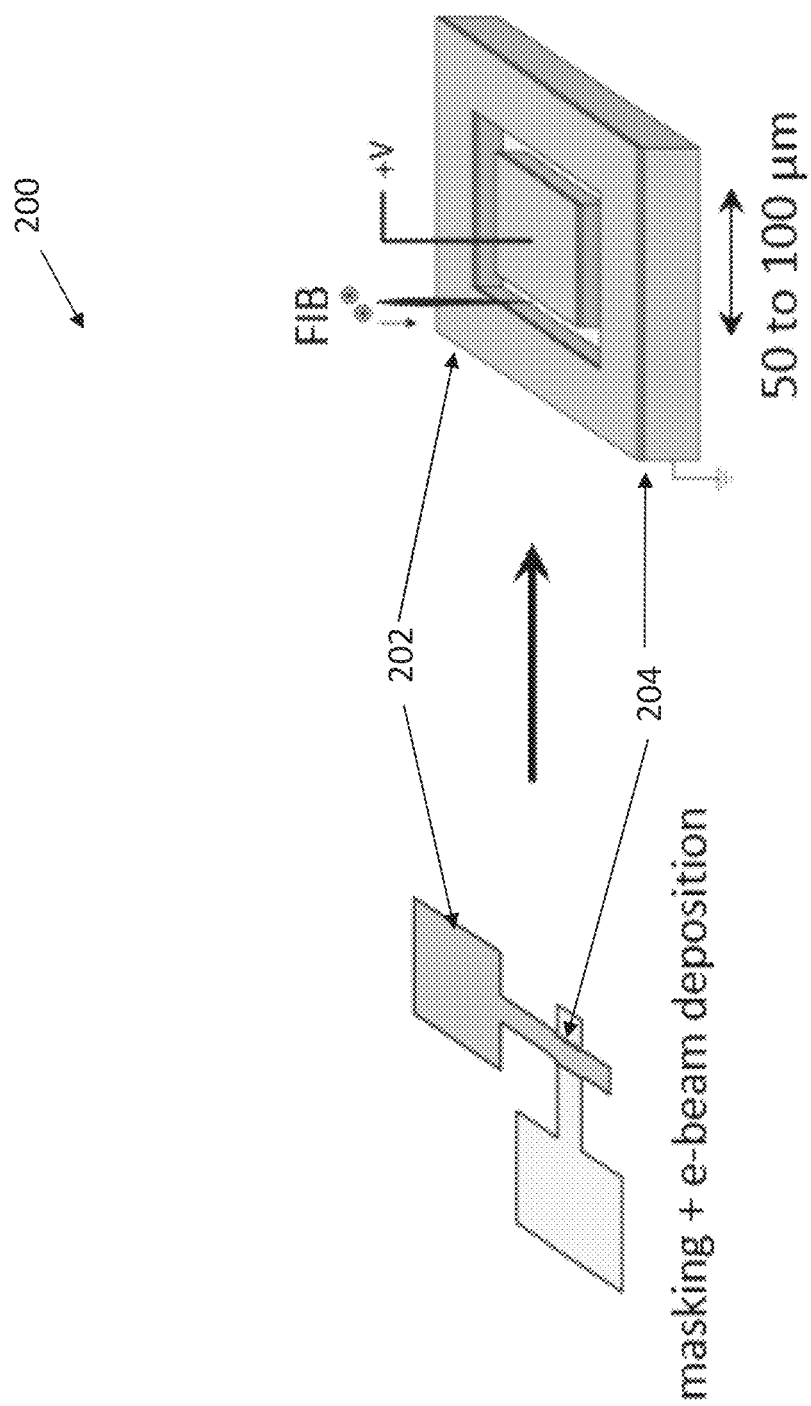
FIG. 2A is a schematic diagram illustrating the use of focused ion beam (FIB) milling to define the device boundaries and implanting Au atoms, according to some embodiments.

A first aspect of the techniques described herein includes a strategy for physically doping the insulator layer with metal atoms. FIG. 2A shows a first exemplary technique 200 for fabricating an RS device using FIB milling to define the device boundaries and implant atoms, according to some embodiments. As shown in FIG. 2A, a FIB milling can be used to define the device boundaries after the top layer 202 (e.g., Au layer) is deposited. The insulator layer 204 can be doped by using a Ga focused ion beam milling to mill away material to define the spatial extent of a single device. A high energy ion beam, e.g., a 30 keV Ga ion beam, can be used, which is highly energetic and has the beneficial side effect of implanting Au atoms from the top metal electrode deeper into the insulator, which can serve as bridges for a conductive filament or network of filaments to form. Other highly electronegative dopants, such as Pd and Pt, have similar mechanisms and effects. Thus, Au and/or these highly electronegative metal dopants can improve switching consistency, can eliminate the need for a low-yielding electroforming step needed to make RS devices operational after fabrication, or both.

Figure 2B:
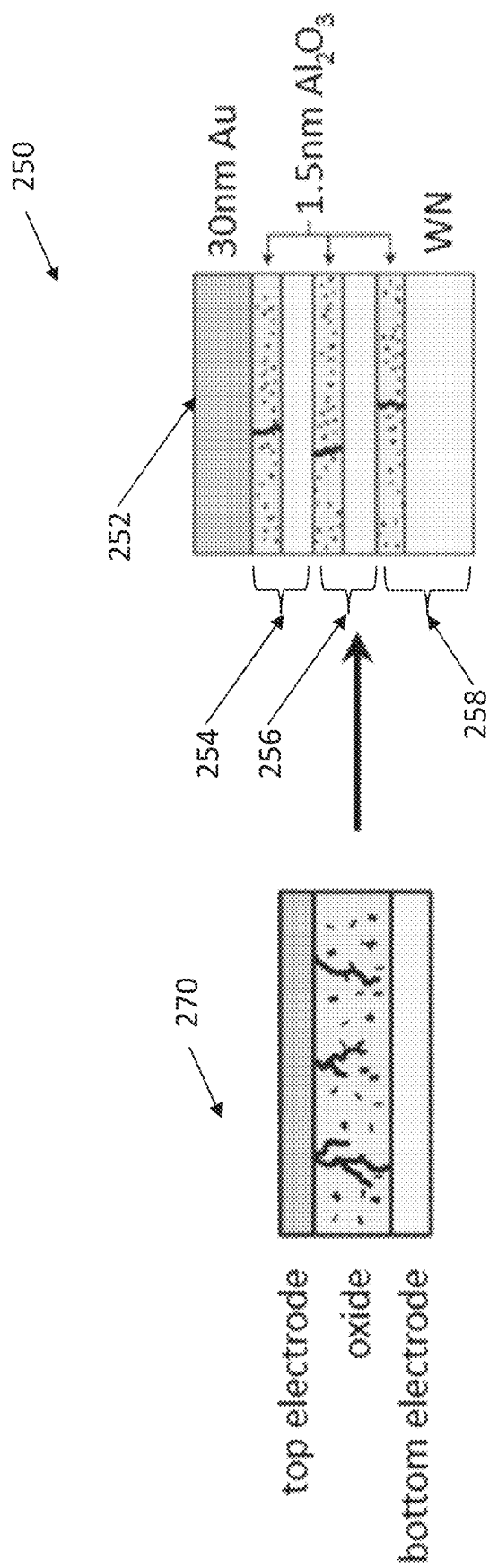
FIG. 2B is a schematic diagram illustrating the distribution of a single insulator layer into three (3) insulator layers separated by a conductive spacer, according to some embodiments.

A second aspect of the techniques described herein, includes a strategy for distributing a single insulator layer into two (2) or three (3) (or more) insulator layers separated by a conductive spacer, which is tungsten nitride (WN) for this exemplary device. As shown in FIG. 2B, a MIMIMIM stack with 3 insulator layers is used for the techniques (e.g., as compared to a structure with just one insulator layer 270). A thickness, such as 30 nm to 100 nm Au, can be used as the top metal electrode 252. The Au layer can be deposited by sputtering and/or ebeam-deposition. In some examples, the intervening layers of insulators 254, 256 and 258 are repeated stacks of $Al_2O_3$ and WN layers that are each of between 1.5 nm to 5 nm thick. WN is a conductive "metal" layer which serves as spacers between adjacent insulating $Al_2O_3$ layers. WN can be used as the bottom electrode for convenience because it can be deposited alongside the middle $Al_2O_3$ and WN active layers in the same process step with ALD. It should be appreciated that other nitrides or materials can be used instead of WN, including other conductive nitrides or materials that can maintain a distinct boundary with the oxide layer without significant interdiffusion. This can include, for example, titanium nitride (TiN), zirconium nitride (ZrN), hafnium nitride (HfN), vanadium nitride (VN), niobium nitride (NbN), tantalum nitride (TaN), molybdenum nitride (MoN), and chromium nitride (CrN).

Figure 3:
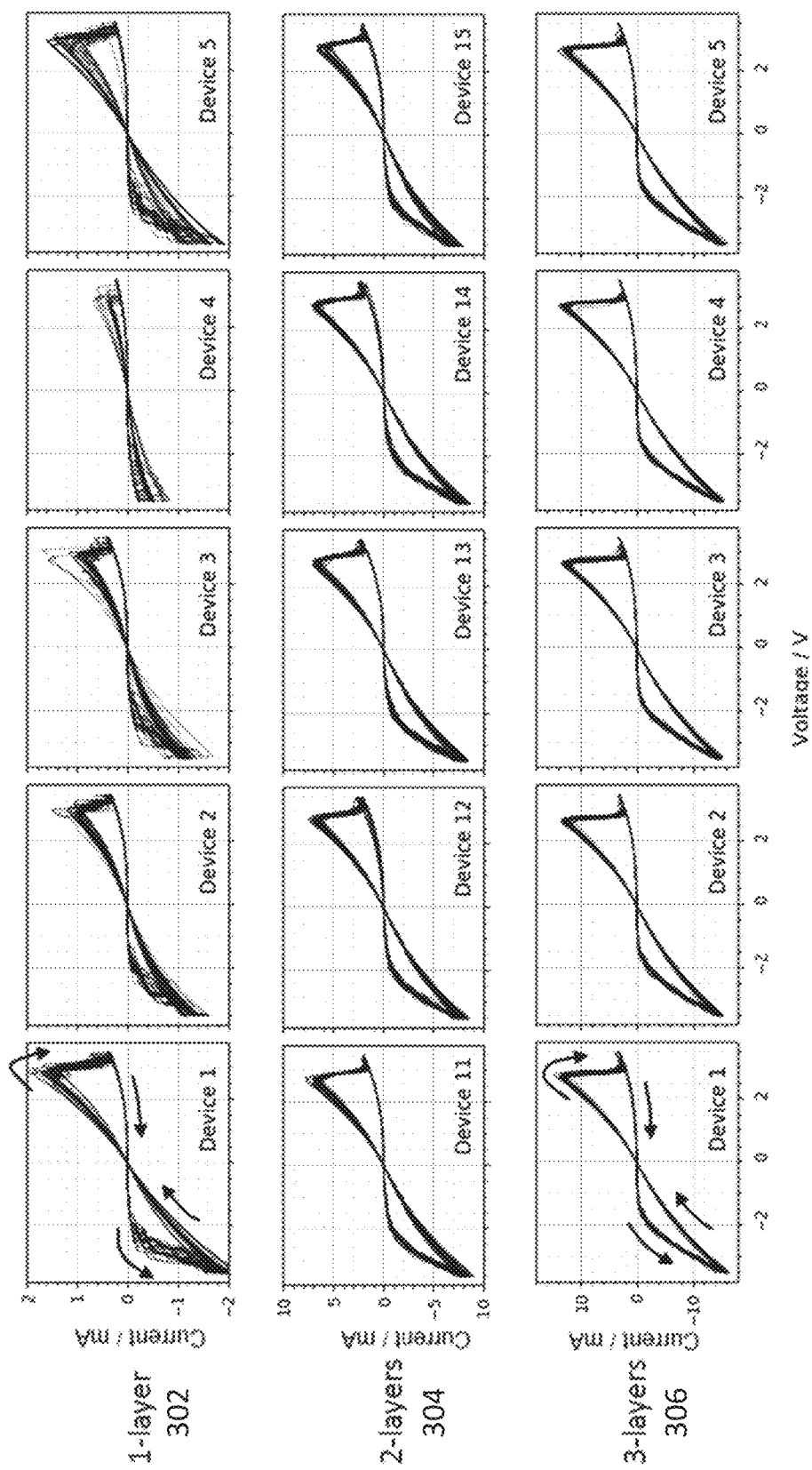
FIG. 3 is a diagram showing performance tests for RS devices with one oxide layer, two oxide layers, and three oxide layers, according to some embodiments.

Therefore, as described herein (e.g., including in conjunction with FIGS. 2A-2B), the techniques can improve RS devices (e.g., that described in U.S. Pat. No. 8,717,803) by increasing the single insulator layer structure to a structure with multiple insulator layers, and/or by doping the constituent insulator (e.g., oxide) layers. In some embodiments, multiple insulator layers are used in conjunction with doped oxide layers. The subsequent results demonstrate a significant improvement in switching consistency in going from a 1 oxide layer system (as shown in FIG. 2B as 270) to a 2 oxide layer system, and from a 2 oxide layer system to a 3 oxide layer system. The effect of changing from a single layer oxide to a multiple layer oxide device is shown in FIG. 3. Multiple devices were fabricated to test the effects of increasing the number of oxide layers in a resistive switching device, including a device with a 1 oxide layer system 302, a 2 oxide layer system 304, and a 3 oxide layer system 306. For this example, the total thickness of $Al_2O_3$ was kept constant at 6.0 nm but distributed across 1 oxide layer (top row), 2 oxide layers (middle row) or 3 oxide layers (bottom row), spaced by 3 nm of WN. For each device shown, 10 cycles are shown in black and another subsequent 10 cycles is shown in gray. There is significant improvement in the consistency of the device performance with multilayer oxides. In a typical RS device with a single oxide layer 302, the switching cycles has large variations from cycle-to-cycle and device-to-device. In moving from a single oxide layer 302 to a dual oxide layer device 304, there is a significant improvement in consistencies across cycles and across devices. When moving to a triple oxide layer device 306, there is still an even sharper LRS to HRS transition, with a slight further improvement in switching consistency.

Figure 4:
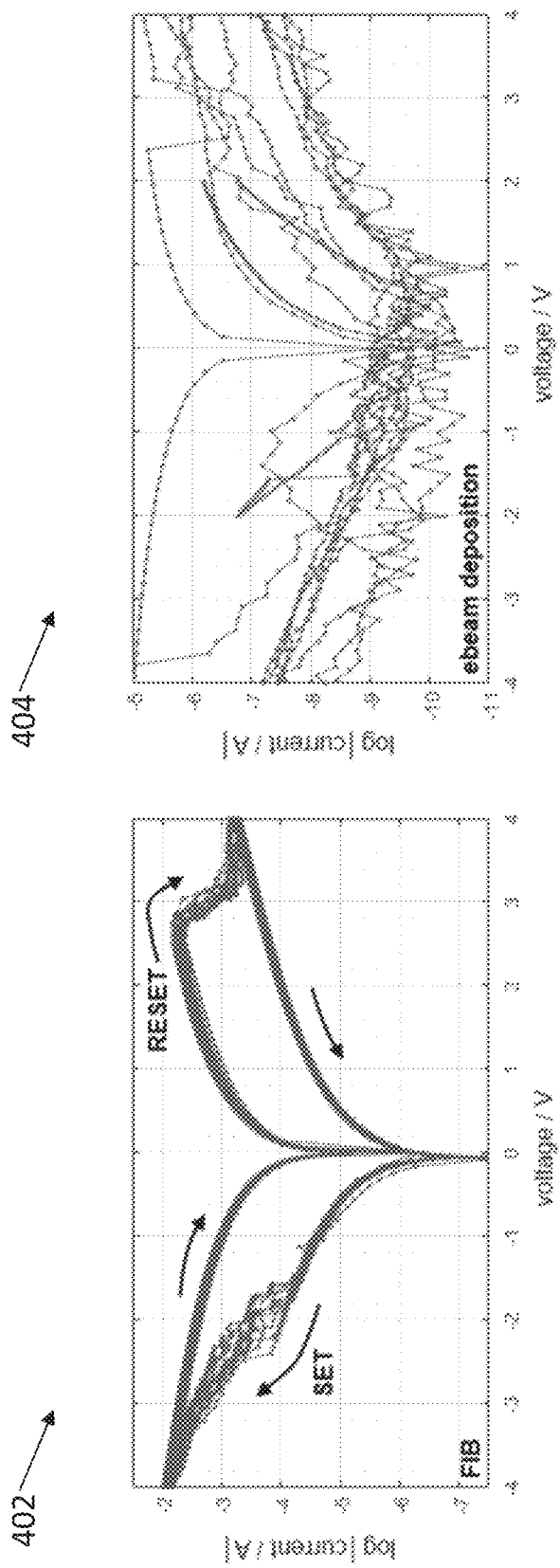
FIG. 4 is a diagram showing a first plot for a stack with Au sputtered and the device boundaries milled out with FIB and a second plot for a stack with an Au square contact pad deposited through a shadowmask, according to some embodiments.

An example of the effect of using FIB for fabricating a RS device is shown in FIG. 4. A 3-layer oxide stack with stack identity $WN/Al_2O_3/WN/Al_2O_3/WN/Al_2O_3$ was first deposited with ALD. For the device for the left plot 402, 100 nm Au was sputtered and the device boundaries milled out with FIB. For the device corresponding to the right plot 404, a 100 nm thick Au square contact pad was deposited through a shadowmask. The switching performance of a device fabricated with FIB clearly shows a well-defined switching behavior because it demonstrates much more consistent set and reset plots compared to using a shadowmask.

Therefore, for devices of similar sizes and film thicknesses, the use of FIB in fabrication can allow a device to cycle between the HRS and LRS consistently (e.g., whereas a typical use of ebeam deposition typically produces a device which has wildly erratic behavior). The benefits of the use of FIB implantation can be due to the Au atoms being implanted as dopant atoms in the intrinsic $Al_2O_3$ insulating layers. Using the SKIM computation software, Au can be implanted about 20 nm deep into $Al_2O_3$ with a 30 keV Ga ion beam. Such Au dopant atoms can be good stationary bridge atoms for migrating oxygen vacancies in $Al_2O_3$. DFT studies were used to understand how Au dopant atoms were responsible for a good switching consistency in devices made using the techniques described herein. These DFT studies showed that electronegative dopants, like Au, Pt or Pd, promote the formation of oxygen vacancies around it to create conductive clusters of oxygen vacancies. These clusters can further bridge up to form conductive networks or filaments of clusters as oxygen vacancies can migrate under an electric field and span across the insulator layer. When bridging occurs, the device changes from HRS to LRS because conduction can occur by electrons hopping through these oxygen vacancy states.

The benefits of splitting up of a single oxide layer into multiple thinner oxides have also been identified by a network simulation model. Having multiple oxide layers where filaments can be found can cause a moderating effect for the SET transition and a cascading effect for the RESET transition. One of the oxide layer acts as the active layer which the other layers act as the passive layer. The passive layers act as a series resistor layer, which can smooth out an incrementally increasing SET voltage, leading to a gradual and repeatable SET behavior, while causing RESET to have a repeatable threshold and a sharp transition. In addition, or alternatively, multiple shorter filaments can lead to a more consistent switching behavior, e.g., from a less stochastic formation process compared to a single long filament.

Further Embodiments and Examples for Doping

A computation study was performed to understand the mechanisms of the doping strategy discussed herein, which showed that the doping strategy can be broadened to use noble metal dopant atoms other than Au. For example, the use of implanted Pt and Pd was demonstrated experimentally and computationally to also work well in greatly improving the switching consistency of our devices.

Doping can be performed using various methods. For example, as discussed herein, doping can be done using an indirect method by using Ga-ion FIB milling to implant Au atoms from the top electrode deeper into the device. In some examples, Au atoms can be implanted into an oxide using commercially available ion implantation equipment, such as those used to modify the doping profile in Si wafers at industrial scales. In some examples, the Au atoms can be doped by co-sputtering Au with the oxide material, which can also lead to a high consistency RS devices. Co-sputtering can offer further degree of freedoms in design, as it can allow for a finer tuning of the vertical doping profile.

The use of doped noble metal atoms in an actual device can be identified empirically from its I-V switching curve, and also analytically, such as by atomic probe tomography (APT), x-ray photoelectron spectroscopy (XPS), and/or high-resolution transmission electron microscopy with energy dispersive X-ray analyzer (HRTEM-EDX).

Further Embodiments and Examples for Multi-Layer Oxides

Bi-layer oxides in RS devices can comprise various forms, such as two dissimilar oxide material stacked directly against each other. Such a configuration can be a limited strategy because it can be hard to maintain phase segregation in these two oxides (e.g., leading to shorter device lifespans), because it is typically not feasible to have more complicated designs of 3 or more oxide layers (e.g., due to the need to find multiple good choices for the oxide identities), and/or the like. The techniques described herein can be scaled up to test more complicated stacks. The techniques can be used to test more complicated stacks, for example, because one (1) oxide and one (1) conductive material can be intercalated to get as many repeating layers as is desired (e.g., because the number of layers can be increased by simply including additional layers without having to search for other materials for a more complicated stack).

Of note, the techniques described herein can use conductive spacer layers. The use of a conductive spacer layer can improve switching consistency, such as by allowing shorter filaments to form instead of one long filament, can allow devices to have a more complicated material stack than what is currently possible, or both. The use of multilayer oxides and conductive spacers in an actual RS device can be easily identified and/or verified by a cross-sectional transmission electron microscopy (TEM) analysis.

Exemplary Market Impact

RS devices are actively being pursued by several large semiconductor industries for next generation resistive RAM (ReRAM) but progress in understanding and in the single-device performance in academic communities have slowed down in the last few years due to challenges in studying the elusive filament formation process. Nonetheless, the research community has marched on with demonstrations of large scale RS arrays for use in machine learning applications, hardware neuromorphic networks, and hardware-implemented matrix multiplications. The often stated justification in the use of inconsistently switching and low yield RS units in these large scale arrays is that these machine learning applications do not require high accuracy computation and can adapt to loss of function of individual computational cell. However, this is typically not a valid excuse because the use of inconsistently performing units will complicate the use these cells by circuit designers and will later lead to challenges in debugging a system when each individual cell is going to exhibit switching variation both across cycles and across cells.

The rapid onward march of the RS community towards large scale array demonstrations is reflective of strong demands for hard-ware-implemented machine learning that can surpass the speed and energy performance from current use of GPUs or TPUs. As of 2018, there are no signs in the slowing down in the growth of artificial intelligence and cognitive computing technologies. The increasing emphasis for industries and even the government sector to be data-driven is driving factor behind the Forrestor Research's projected market value for artificial intelligence to be $1.2 trillion in 2020. This market will rely on the availability of large computation power with which traditional CPUs and GPUs alone will not be able to satisfy, so it is expected that huge resources will be invested in the research of next generation hardware neuromorphic circuits which will be more suited to perform the niche calculations required for neural network training and inference problems.

The techniques described herein can achieve a highly consistent resistive switching device with a high device fabrication yield, which can be useful steps in realizing hardware neuromorphic circuits.

Techniques operating according to the principles described herein may be implemented in any suitable manner. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (AMC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, rniddleware, embedded code, or any other suitable type of computer code. Such computer-executable instructions may be written using any of a number of suitable programming languages and/or programmimg or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Further, some techniques described above comprise acts of storing information (e.g., data and/or instructions) in certain ways for use by these techniques. In some implementations of these techniques such as implementations where the techniques are implemented as computer-executable instructions the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as computer-executable instructions, these instructions may be executed on one or more suitable computing device(s) operating in any suitable computer system, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing device co-located or geographically distributed) dedicated to executing the techniques described herein, one or more Field-Programmable Gate Arrays (FPGAs) for carrying out the techniques described herein, or any other suitable system.

A computing device may comprise at least one processor, a network adapter, and computer-readable storage media. A computing device may be, for example, a desktop or laptop personal computer, a personal digital assistant (PDA), a smart mobile phone, a server, or any other suitable computing device. A network adapter may be any suitable hardware and/or software to enable the computing device to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable media may be adapted to store data to be processed and/or instructions to be executed by processor. The processor enables processing of data and execution of instructions. The data and instructions may be stored on the computer-readable storage media.

A computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

What is claimed is:

1. A resistive switching device, comprising:
   a first electrode formed in a substrate;
   a plurality of layers formed above the first electrode, comprising:
      at least three oxide layers, wherein one or more of the at least three oxide layers comprise doped oxide layers; and
      at least two conductive spacers, wherein:
         each pair of oxide layers of the at least three oxide layers are separated by a conductive spacer of the at least two conductive spacers; and
         each of the at least two conductive spacers separates a respective two oxide layers of the at least three oxide layers; and
   a second electrode formed above the plurality of layers, such that the first electrode, the plurality of layers, and the second electrode are in series.

2. The resistive switching device of claim 1, wherein one or more doped oxide layers comprise embedded metal atoms doped using an ion beam used to define a spatial extent of the resistive switching device.

3. The resistive switching device of claim 1, wherein each of the at least three oxide layers comprise a thickness in a range of approximately 1.5 nm to 5 nm.

4. The resistive switching device of claim 1, wherein each of the at least two conductive spacers comprise a thickness in a range of approximately 1.5 nm to 5 nm.

5. The resistive switching device of claim 1, wherein the first electrode comprises tungsten nitride (WN), titanium nitride (TiN), zirconium nitride (ZrN), hafnium nitride (HfN), vanadium nitride (VN), niobium nitride (NbN), tantalum nitride (TaN), molybdenum nitride (MoN), or chromium nitride (CrN).

6. The resistive switching device of claim 1, wherein the second electrode comprises a thickness in a range of approximately 30 nm to 100 nm.

7. The resistive switching device of claim 1, wherein the second electrode comprises gold (Au).

8. The resistive switching device of claim 1, wherein the at least three oxide layers comprise aluminum oxide ($Al_2O_3$).

9. The resistive switching device of claim 1, wherein the at least two conductive spacers each comprise tungsten nitride (WN).

* * * * *